(12) United States Patent
Kim

(10) Patent No.: US 8,282,238 B2
(45) Date of Patent: Oct. 9, 2012

(54) LIGHT EMITTING APPARATUS INCLUDING INDEPENDENTLY DRIVEN LIGHT EMITTING PORTIONS

(75) Inventor: Jae Jo Kim, Ansan-si (KR)

(73) Assignee: Seoul Semiconductor Co., Ltd., Seoul (KR)

( * ) Notice: Subject to any disclaimer, the term of this patent is extended or adjusted under 35 U.S.C. 154(b) by 513 days.

(21) Appl. No.: 12/159,677

(22) PCT Filed: Dec. 28, 2006

(86) PCT No.: PCT/KR2006/005790
§ 371 (c)(1),
(2), (4) Date: Jun. 30, 2008

(87) PCT Pub. No.: WO2007/078091
PCT Pub. Date: Jul. 12, 2007

(65) Prior Publication Data
US 2009/0021186 A1 Jan. 22, 2009

(30) Foreign Application Priority Data
Dec. 30, 2005 (KR) .................. 10-2005-0135767

(51) Int. Cl.
*F21V 9/00* (2006.01)
(52) U.S. Cl. ........ 362/230; 362/231; 362/362; 362/363; 362/800
(58) Field of Classification Search .................. 362/230, 362/231, 227, 362, 363, 375, 800–812
See application file for complete search history.

(56) References Cited

U.S. PATENT DOCUMENTS

| 5,998,925 | A  | * | 12/1999 | Shimizu et al. | 313/503 |
| 2004/0239243 | A1 | * | 12/2004 | Roberts et al. | 313/512 |
| 2005/0242360 | A1 | * | 11/2005 | Su | 257/99 |
| 2006/0007108 | A1 | * | 1/2006 | Utsumi et al. | 345/102 |
| 2006/0049782 | A1 | * | 3/2006 | Vornsand et al. | 315/312 |

FOREIGN PATENT DOCUMENTS

| JP | 2001-209049 | 8/2001 |
| JP | 2005-317873 | 11/2005 |
| KR | 10-2000-0036312 | 7/2000 |
| KR | 10-2005-0103624 | 11/2005 |
| TW | I228841 | 3/2005 |

OTHER PUBLICATIONS

Chinese Preliminary Notice of the First Office Action dated Dec. 11, 2009.

* cited by examiner

Primary Examiner — Tuyet Thi Vo
(74) Attorney, Agent, or Firm — H.C. Park & Associates, PLC

(57) ABSTRACT

The present invention provides a light emitting apparatus comprising: a first light emitting portion for emitting white light with a color temperature of 5700K or more; and a second light emitting portion capable of changing the color temperature of the white light emitted from the first light emitting portion, wherein the first and second light emitting portions are independently driven. Accordingly, the present invention has the advantage that it can be diversely applied to desired atmospheres and uses by implementing white light with various light emitting intensities and color temperatures. Further, there is an advantage in that the cumbersomeness in a process is reduced, the space efficiency is enhanced, and the costs are reduced.

18 Claims, 4 Drawing Sheets

LIGHT EMITTING APPARATUS INCLUDING INDEPENDENTLY DRIVEN LIGHT EMITTING PORTIONS

CROSS REFERENCE TO RELATED APPLICATIONS

This application is the National Stage of International Application No. PCT/KR2006/005790, filed on Dec. 28, 2006, and claims priority from and the benefit of Korean Patent Application No. 10-2005-0135767, filed on Dec. 30, 2005, which are both hereby incorporated by reference for all purposes as if fully set forth herein.

BACKGROUND OF THE INVENTION

1. Field of the Invention

The present invention relates to a light emitting apparatus, and more particularly, to a light emitting apparatus wherein a plurality of light emitting portions are formed in a single package to implement the light with a variety of light emitting intensities and color temperatures.

2. Discussion of the Background

A light emitting diode (LED) is an element in which minority carriers (electrons or holes) are produced using a P-N junction structure of a compound semiconductor and certain light is emitted through recombination of the carriers. The light emitting diode has less electric power consumption and a longer life span of several to several ten times as compared with conventional light bulbs or fluorescent lamps, thereby having reduced electric power consumption and excellent durability. Further, the light emitting diode can be mounted in a narrow space and has strong resistance against vibration. A light emitting apparatus using such a light emitting diode has been used as a display device and a backlight. Recently, studies have been actively conducted to apply the light emitting apparatus for general illumination.

White light emitting diodes have recently appeared in addition to single color light emitting diodes, e.g., red, blue or green light emitting diodes. As a light emitting apparatus using white light emitting diodes is applied to products for vehicle and illumination, demands on the light emitting apparatus has been rapidly increased.

White light can provide various feelings depending on a light source thereof, and such a phenomenon may result from light emitting intensity or color temperature. The color temperature indicates a physical numerical value with respect to color of a light source, and is represented by Kelvin degree (K). As the color temperature rises, the light becomes blue. As the color temperature lowers, the light with strong red-yellow is emitted. In general, the activity of brain and the power of concentration increase as the color temperature rises, while the sensitivity is activated and feeling becomes comfortable as the color temperature lowers. The light emitting intensity and color temperature of such a light source may be appropriately combined to be applied to a desired use. For example, the white light with a high color temperature in a middle degree of the light emitting intensity is desirable in the daytime, in which human beings are mainly active, in order for them to concentrate on their work, and the white light with low color temperature is desirable at night, which is time for rest and sleep, in order for them to feel easy and comfortable. Further, it has been reported that the wavelength and color temperature of light sensitively operates on the growth, activity or the like of plants or animals.

However, since a conventional light emitting apparatus maintains a certain light emitting intensity and color temperature, it is cumbersome that a light emitting apparatus should be individually manufactured depending on its use. In a case where the implementation of light with different color temperatures is required as described above, a plurality of light emitting apparatuses should be manufactured and mounted to be operated. Therefore, there is a disadvantage in that a light emitting apparatus is increased in manufacturing cost and occupies a large mounting space.

SUMMARY OF THE INVENTION

The present invention is conceived to solve the aforementioned problems. An object of the present invention is to provide a light emitting apparatus wherein a plurality of light emitting portions are formed in a single package to implement the light with a variety of light emitting intensities and color temperatures, thereby being applied to a desired environment and use and enhancing the efficiency of spaces and cost.

In order to achieve these objects of the present invention, the present invention provides a light emitting apparatus comprising: a first light emitting portion for emitting white light with a color temperature of 5700K or more; and a second light emitting portion capable of changing the color temperature of the white light emitted from the first light emitting portion, wherein the first and second light emitting portions are independently driven. The light emitting apparatus may further comprise a controller for controlling voltage applied to the first and/or second light emitting portion from the outside. The controller may control the voltage input from the outside in accordance with time and applies it to the first or second light emitting portion.

The first light emitting portion may comprise a blue light emitting diode chip and green and red or yellow light emitting phosphor. The first light emitting portion may comprise an ultraviolet light emitting diode chip and red, green and blue light emitting phosphors.

The second light emitting portion may comprise at least one light emitting diode chip emitting light with a wavelength of 510 to 760 nm. The second light emitting portion may comprise a plurality of light emitting diode chips emitting light with different wavelengths, and the plurality of light emitting diode chips can be selectively driven.

The first and second light emitting portions may be simultaneously driven to have a color temperature in the range of 2800 to 3700K.

The present invention has an advantage in that a plurality of light emitting portions are formed in a single package to implement white the light with a variety of light emitting intensities and color temperatures, thereby being variously applied to a desired environment and use. Furthermore, there is an effect in that light emitting portions, each of which constitutes a separate package in a prior art, are formed in a single package, thereby reducing the cumbersomeness in a process, enhancing the space efficiency, and reducing the costs.

DETAILED DESCRIPTION OF THE ILLUSTRATED EMBODIMENTS

Figure 1:
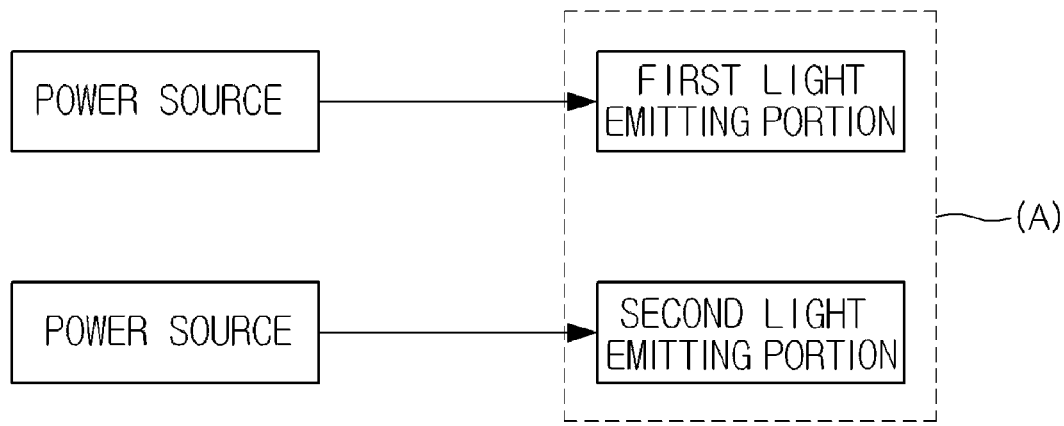
FIG. 1 is a block diagram conceptually illustrating a first embodiment according to the present invention.

Hereinafter, preferred embodiments of the present invention will be described in detail with reference to the accompanying drawings. However, the present invention is not limited to the embodiments disclosed below but may be implemented into different forms. These embodiments are provided only for illustrative purposes and for full understanding of the scope of the present invention by those skilled in the art. Throughout the drawings, like elements are designated by like reference numerals.

The present invention is characterized in that a first light emitting portion emitting white light with a relatively high color temperature and a second light emitting portion for adjusting color temperature are included in a single package.

FIG. 1 is a block diagram conceptually illustrating a first embodiment according to the present invention.

Referring to FIG. 1, a light emitting apparatus is characterized in that it comprises a first light emitting portion emitting white light with a color temperature of 5700K or more and a second light emitting portion capable of changing the color temperature of the white light emitted from the first light emitting portion, wherein the first and second light emitting portions can be driven independently of each other.

The first light emitting portion emits white light with a color temperature of 5700K or more, i.e., white light known as daylight. To this end, the first light emitting portion may comprise a light emitting diode chip emitting blue light and a phosphor for emitting yellow light. That is, the white light is implemented through the mixture of blue light emitted from the light emitting diode chip and yellow light wavelength-converted by the phosphor.

Further, the first light emitting portion may comprise a light emitting diode chip emitting blue light and phosphors emitting green light and red light. For example, the first light emitting portion may comprise a blue light emitting diode chip, a green light emitting phosphor with a light emitting peak at 515 nm and an orange light emitting phosphor with a light emitting peak at 605 nm. The first light emitting portion implements white light through the mixture of blue light emitted from the light emitting diode chip and green and orange light wavelength-converted by the respective phosphors. There is an advantage in that the light emitting apparatus including such a configuration can obtain a more enhanced color rendering property as compared with the example including the blue light emitting diode chip and the yellow light emitting phosphor.

Further, the first light emitting portion may comprise a light emitting diode chip emitting light in an ultraviolet region and phosphors for emitting red, green and blue light. That is, white light is implemented through the mixture of ultraviolet light emitted from the light emitting diode chip and red, green and blue light wavelength-converted by the phosphor.

The configuration of the light emitting diode chip and the phosphor, which the first light emitting portion comprises, is not limited to the aforementioned examples but may variously formed for the purpose of implementing white light with a color temperature of 5700K or more. Further, the number of light emitting diode chips constituting the first light emitting portion is not limited, but a plurality of the light emitting diode chips may be formed. At this time, the plurality of light emitting diode chips are configured to be respectively and selectively driven, whereby the light emitting intensity of white light can be adjusted.

The second light emitting portion comprises a light emitting diode chip with a light emitting peak at 510 to 760 nm. Such a light emitting diode chip implements various colors of amber, orange, yellow, red and the like. The second light emitting portion may comprise one light emitting diode chip or a plurality of light emitting diode chips. In a case where the second light emitting portion comprises a plurality of light emitting diode chips, the second light emitting portion may comprise light emitting diode chips emitting light with different wavelengths such that the respective light emitting diode chips can be independently driven.

In such a light emitting apparatus, since electrical connection for each of the plurality of light emitting portions is possible in a package A, the first and second light emitting portions can be driven independently. For example, in a case where power is applied only to the first light emitting portion, daylight white light with a color temperature of 5700K or more can be implemented. In a case where power is applied only to the second light emitting portion, green- or red-based light with a light emitting peak at 510 to 760 nm can be implemented. Further, in a case where power is simultaneously applied to both the first and second light emitting portions, white light with low color temperature can be implemented due to the mixture of the white light emitted from the first light emitting portion and the green- or red-based light emitted from the second light emitting portion. That is, warm white light with a color temperature of 2800 to 3700K can be implemented. Accordingly, in the light emitting apparatus of the present embodiment, daylight white light and warm white light can be implemented through the selective operation of the first and second light emitting portions.

In such mixed light of the first and second light emitting portion, the second light emitting portion comprises a plurality of light emitting diode chips such that they can be selectively driven as described above. Accordingly, the color temperature can be more variously adjusted through the combination of the white light emitted from the first light emitting portion and the light with various light emitting wavelengths emitted from the second light emitting portion.

Since such a light emitting apparatus of the present invention can implement white light with various light emitting intensities and color temperatures, there is an advantage in that the light emitting apparatus can be diversely applied to desired atmospheres and uses with the package A. For example, the activity of brain and the power of concentration can be enhanced due to the daylight white light with a color temperature of 5700K or more only by driving the first light emitting portion in the daytime, and an easy and comfortable rest can be taken due to the warm white light with a color temperature of 2800 to 3700K by simultaneously driving the first and second light emitting portions at night.

FIGS. 2 to 5 are schematic sectional views showing examples to which the first embodiment according to the present invention is applied to a variety of structures.

Figure 2:
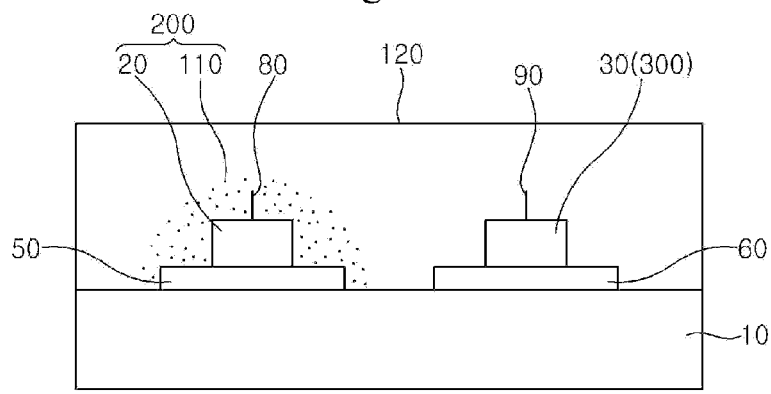
FIGS. 2 to 5 are schematic sectional views showing examples to which the first embodiment according to the present invention is applied to a variety of structures.

Referring to FIG. 2, a light emitting apparatus comprises a substrate 10, electrodes 50 and 60 formed on the substrate 10, a first light emitting portion 200 emitting white light, a second light emitting portion 300 emitting red-based light, and a molding member 120 encapsulating the first and second light emitting portions 200 and 300 on the substrate 10.

The first light emitting portion 200 comprises a first light emitting diode chip 20 emitting blue light and a phosphor 110 for emitting yellow light. Daylight white light with a color temperature of 5700K or more is implemented through the mixture of the blue light emitted from the first light emitting diode chip 20 and the yellow light wavelength-converted by the phosphor 110. Of course, the present invention is not limited thereto but may be formed with various configurations as in the aforementioned embodiment. The phosphor 110, which is in the form mixed in a curable resin, such as epoxy or silicone resin, may be dotted on the first light emitting diode chip 20.

The second light emitting portion 300 comprises a second light emitting diode chip 30 with a light emitting peak at 510 to 760 nm. For example, the second light emitting portion 300 comprises the light emitting diode chip 30 emitting red light.

The first and second light emitting diode chips 20 and 30 are mounted on the first and second electrodes 50 and 60, respectively. Each of the electrodes 50 and 60 may be formed of a metallic material containing Cu or Al with superior conductivity, and formed on the substrate 10 through a printing technique or using an adhesive agent.

Preferably, the first and second electrodes 50 and 60 with the first and second light emitting diode chips 20 and 30 respectively mounted thereon are formed to be insulated from each other in order to independently drive the first and second light emitting portions 200 and 300. The first and second light emitting diode chips 20 and 30 are connected to third and fourth electrodes (not shown) formed corresponding to the first and second electrode 50 and 60 through first and second wires 80 and 90, respectively. Such an electrode pattern is not limited to the aforementioned example but may vary according to the number, configuration and position of the light emitting chips.

Further, the molding member 120 encapsulating the first and second light emitting diode chips 20 and 30 is formed on the substrate 10. The molding member 120 may be formed through an injection process using predetermined transparent epoxy resin. Further, the molding member 120 may be formed by manufacturing its preform using an additional mold and then pressurizing and heat treating it. The molding member 120 may be formed in various shapes such as an optical lens shape, a flat-panel shape and a shape having a predetermined irregularity on its surface.

In such a light emitting apparatus, since electrical connection for each of the plurality of light emitting diode chips 20 and 30 is possible in one package, the first and second light emitting portions 200 and 300 can be independently driven. For example, in a case where a voltage is applied to the first electrode 50 and the third electrode in the first light emitting portion 200, daylight white light with a color temperature of 5700K or more can be implemented. Further, in a case where a voltage is applied to the second electrode 60 and the fourth electrode in the second light emitting portion 300, red light can be implemented. Furthermore, in a case where a voltage is applied simultaneously to the first and second electrodes 50 and 60 and the third and fourth electrodes such that the first and second light emitting portions 200 and 300 are simultaneously driven, warm white light, of which the color temperature lowers, can be implemented due to the mixture of the white light emitted from the first light emitting portion 200 and the red light emitted from the second light emitting portion 300.

As such, the light emitting apparatus according to the present invention has the advantage that daylight white light and warm white light with different color temperatures can be implemented through the selective operating of the first and second light emitting portions 200 and 300. Therefore, according as a light emitting apparatus implementing white light with various color temperatures is manufactured, it can be variously applied in various ways and a multi-functional light emitting apparatus in a package is possible. Further, there is an advantage in that a light emitting apparatus, which included additional packages in a prior art, is formed in the single package, thereby reducing the cumbersomeness in a process, enhancing the space efficiency, and reducing the costs.

Figure 3:
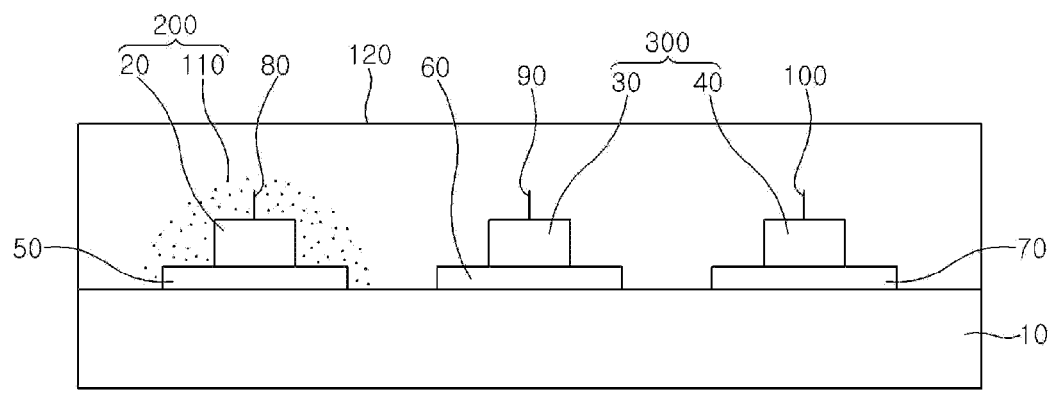

Referring to FIG. 3, a light emitting apparatus comprises a substrate 10, electrodes 50, 60 and 70 formed on the substrate 10, a first light emitting portion 200 emitting white light, a second light emitting portion 300 capable of changing the color temperature of the white light emitted from the first light emitting portion, and a molding member 120 encapsulating the first and second light emitting portions 200 and 300 on the substrate 10. The present light emitting apparatus is almost identical with that of FIG. 2. However, the second light emitting portion 300 of FIG. 3 comprises a plurality of the light emitting diode chips 30 and 40. The detailed descriptions overlapping with those of the previous example will be omitted.

The first light emitting portion 200 comprises a first light emitting diode chip 20 emitting blue light and a phosphor 110 for emitting yellow light, so that daylight white light is implemented through the mixture the blue light emitted from the first light emitting diode chip 20 and the yellow light wavelength-converted by the phosphor 110.

The second light emitting portion 300 comprises the second and third light emitting diode chips 30 and 40, each of which has a light emitting peak at 510 to 760 nm. The second and third light emitting diode chips 30 and 40 may emit the light with the same color or different colors from each other. For example, the second light emitting portion comprises the second light emitting diode chip 30 emitting red light and the third light emitting diode chip 40 emitting green light.

The first, second and third light emitting diodes 20, 30 and 40 are mounted on the first, second and third electrodes 50, 60 and 70, respectively. The second and third light emitting diode chips 30 and 40 of the second light emitting portion 300 may also be formed to be independently driven simultaneously when the first and second light emitting portions 200 and 300 are independently driven. To this end, the first, second and third light emitting diode chips 20, 30 and 40 are mounted on the first, second and third electrodes 50, 60 and 70 formed corresponding thereto, and connected to fourth, fifth and sixth electrodes (not shown) through first, second and third wires 80, 90 and 100, respectively.

In such a light emitting apparatus, since the electrical connection for each of the plurality of light emitting diode chips 20, 30 and 40 is possible in a single package, the first and second light emitting portions 200 and 300 can be independently driven, and the plurality of light emitting diode chips 30 and 40 of the second light emitting portion 300 can also be selectively driven. Accordingly, in a case where the first light emitting portion 200 is driven, daylight white light with a color temperature of 5700K or more can be implemented. In a case where the first and second light emitting portions are simultaneously driven, warm white light, of which the color temperature lowers, can be implemented. Further, there is an advantage in that the selection range of light emitting intensity and color temperature can be more widened as the second and third light emitting diode chips 30 and 40 of the second light emitting portion 300 are selectively driven.

Although the second light emitting portion comprises a plurality of the light emitting diode chips in the aforementioned description, the present invention is not limited thereto. That is, the first light emitting portion may comprise a plurality of the light emitting diode chips. Accordingly, the selection range of light emitting intensity and color temperature can be more widened.

Further, the plurality of light emitting diode chips of the first or second light emitting portion may be variously configured to be connected in serial or parallel in order to be more stably driven.

Figure 4:
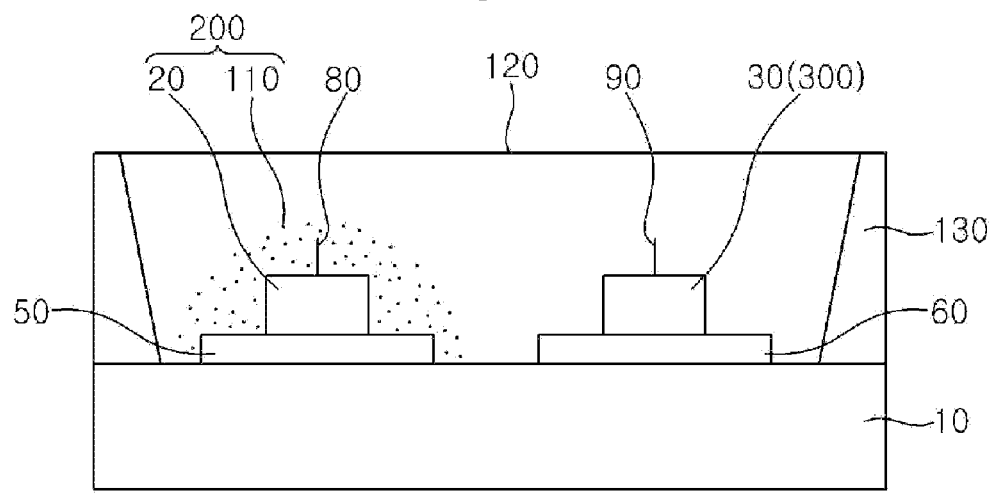

Referring to FIG. 4, an example, which is applied to a top view type structure, is illustrated. A light emitting apparatus comprises a substrate 10, electrodes 50 and 60 formed on the substrate 10, a first light emitting portion 200 emitting white light, and a second light emitting portion 300 emitting red-based light. The present light emitting apparatus is the same as the cases of FIGS. 2 and 3 except that the case of FIG. 4 comprises a reflector 130 formed on the substrate 10 to surround the first and second light emitting portions 200 and 300 and a molding member 120 formed in a central hole of the reflector 130 to encapsulate the first and second light emitting portions 200 and 300. The detailed descriptions overlapping with those of the previous examples will be omitted.

The reflector 130 is formed on the substrate to surround a plurality of light emitting diode chips 20 and 30. At this time, in order to enhance the luminance and the light gathering capability, an inner wall of the reflector 130 surrounding the light emitting diode chips 20 and 30 may be formed to have a certain inclination. This is preferable in order to maximize the reflection of light emitted from the light emitting diode chips 20 and 30 and to enhance the light emitting efficiency.

Figure 5:
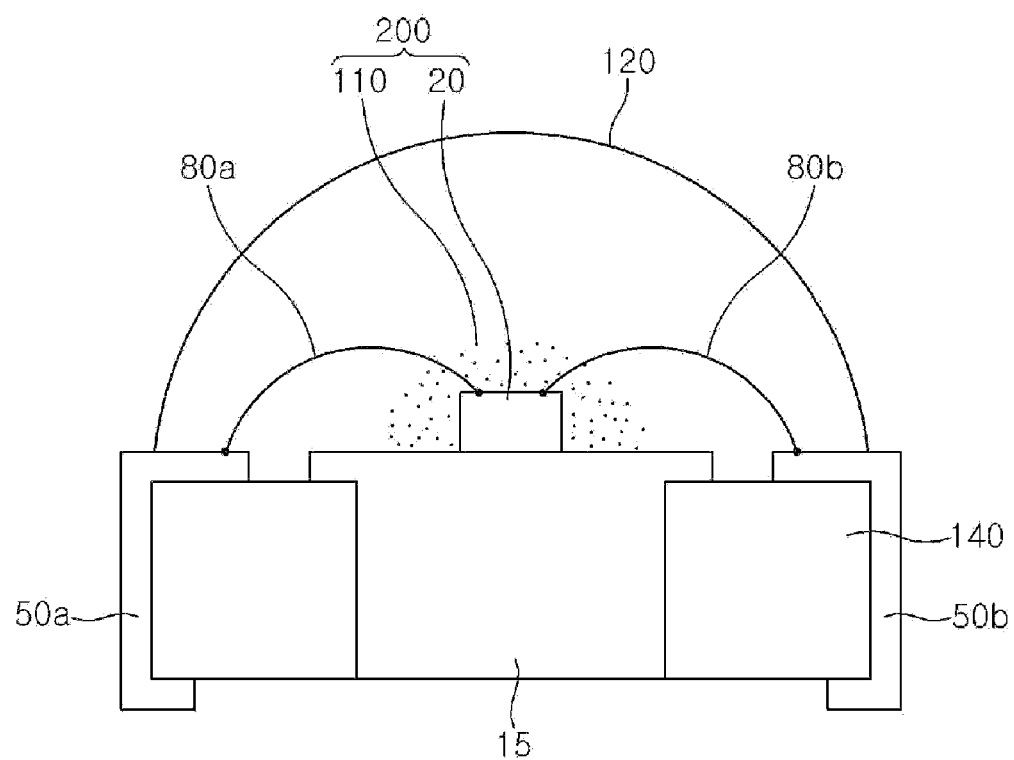

Referring to FIG. 5, a light emitting apparatus comprises a housing 140 with electrodes 50*a* and 50*b* formed at both sides thereof and a through-hole, a substrate 15 mounted in the through-hole of the housing 140, a first light emitting portion 200 mounted on the substrate 15 to emit white light, a second light emitting portion (not shown) emitting red-based light, and a molding member 120 encapsulating the first and second light emitting portions 200. The detailed descriptions overlapping with those of the previous examples will be omitted.

At this time, the substrate 15 is configured as a heat sink using a material with superior thermal conductivity, so that heat diffused from a light emitting diode chip 20 can be more effectively radiated. The substrate may extend to an external heat sink so as to obtain a higher heat radiation effect.

As such, this embodiment may be applied to products with various structures, and for example, formed on a printed circuit board (PCB) or lead terminal.

This embodiment is configured such that it comprise a first light emitting portion emitting white light with a color temperature of 5700K or more and a second emitting red-based light and the first and second light emitting portions can be independently driven.

Further, a light emitting apparatus of the present invention may be formed such that it comprises first and second light emitting portions, and a controller further includes the second light emitting portion so as to control the operation thereof. This will be described below in a following second embodiment. The detailed descriptions overlapping with those of the first embodiment will be omitted.

Figure 6:
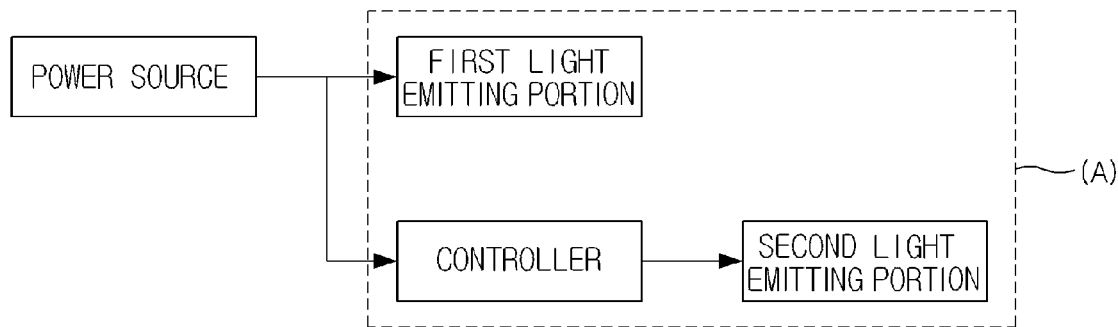
FIG. 6 is a block diagram conceptually illustrating a second embodiment according to the present invention.

FIG. 6 is a block diagram conceptually illustrating the second embodiment according to the present invention.

Referring to FIG. 6, a light emitting apparatus is characterized in that it comprises a first light emitting portion emitting white light with a color temperature of 5700K or more, a second light emitting portion capable of changing the color temperature of the white light emitted from the first light emitting portion, and a controller connected to the second light emitting portion, and the controller controls the voltage applied to the second light emitting portion from the outside.

The first light emitting portion emits white light with a color temperature of 5700K or more, i.e., white light known as daylight. To this end, the first light emitting portion may comprise a light emitting diode chip emitting blue light and a phosphor for emitting yellow light. Further, the first light emitting portion may comprise a light emitting diode chip emitting blue light and a plurality of phosphors for emitting light in a region from green to yellow. Furthermore, the first light emitting portion may comprise a light emitting diode chip emitting light in an ultraviolet region and phosphors for emitting red, green and blue light.

The second light emitting portion comprises at least one light emitting diode chip with a light emitting peak at 510 to 760 nm.

The controller, which is to control the voltage applied to the second light emitting portion, may comprise a timer and a voltage controller circuit. That is, after controlling the voltage input from an external power source to the controller in accordance with time through the timer and the voltage controller circuit, the controlled voltage is transmitted to the second light emitting portion.

Figure 7:
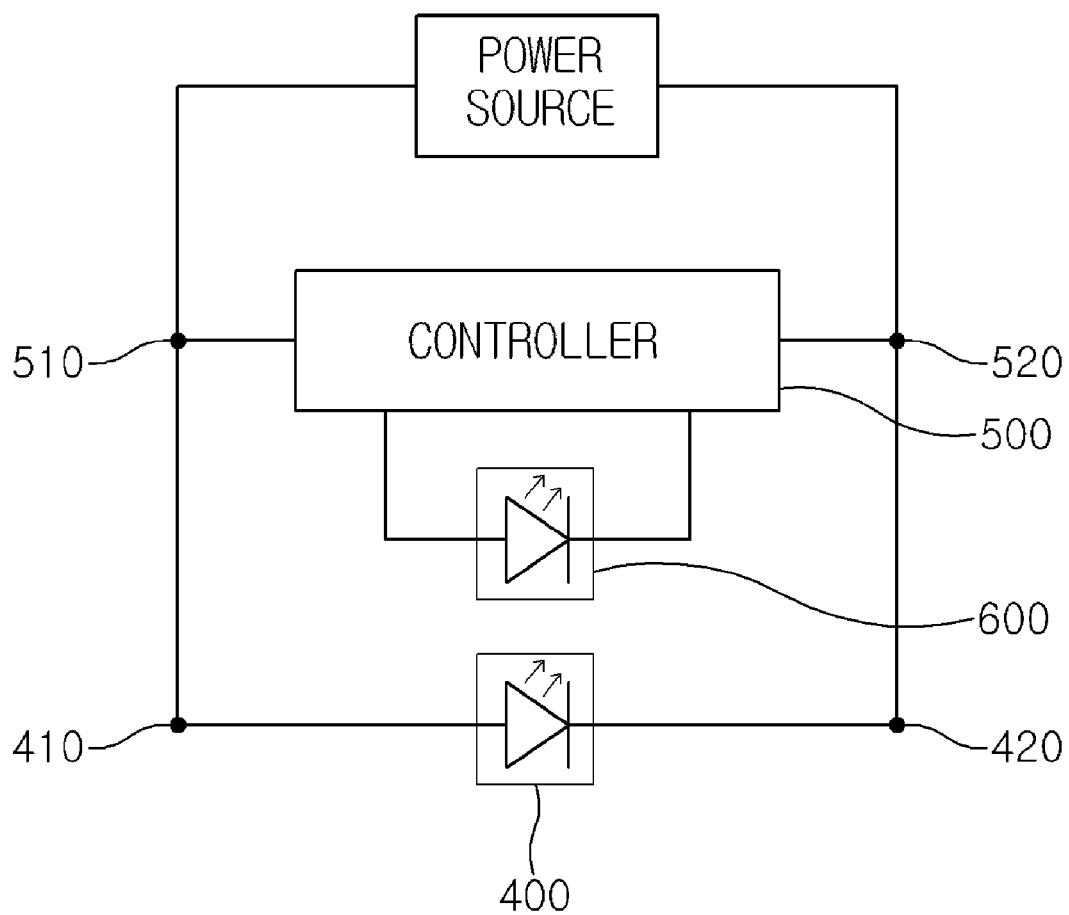
FIG. 7 is a circuit diagram illustrating the second embodiment of the present invention.
Figure 8:
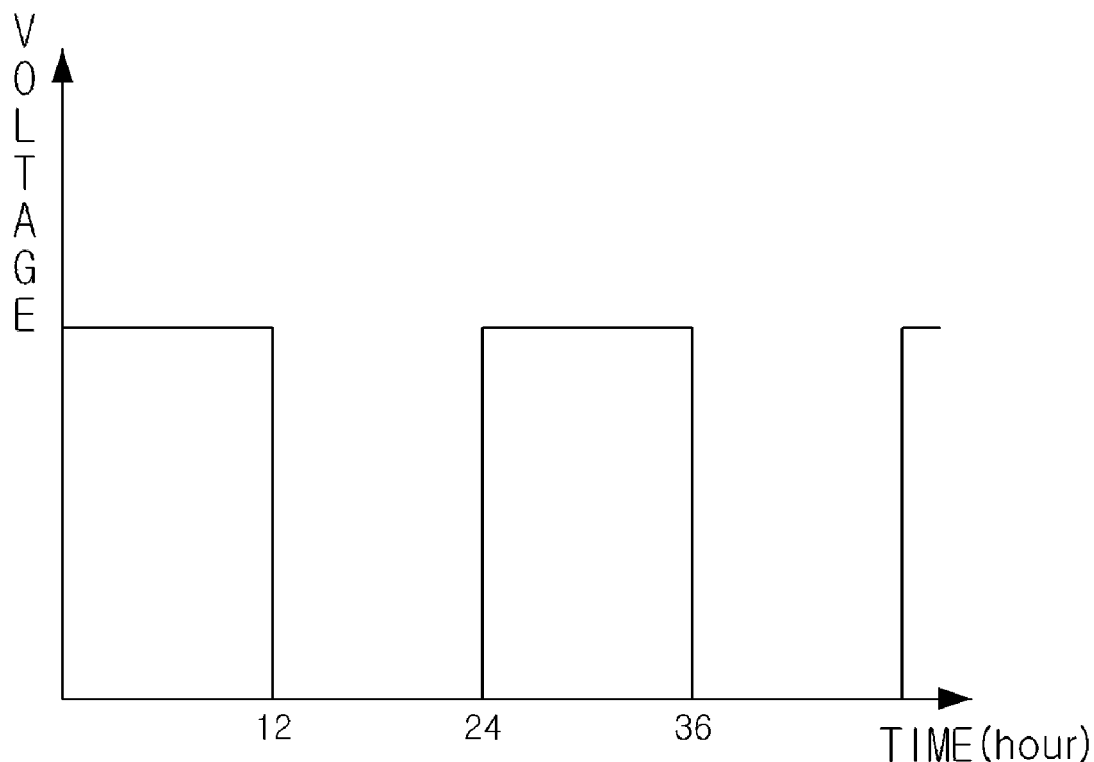
FIG. 8 is a graph illustrating the operation of a controller of the second embodiment according to the present invention.

FIG. 7 is a circuit diagram illustrating the second embodiment of the present invention, and FIG. 8 is a graph illustrating the operation of the controller.

Referring to FIG. 7, the light emitting apparatus comprises a first light emitting portion 400 connected to first and second power connection terminals 410 and 420, a controller 500 connected to third and fourth power connection terminals 510 and 520 to control the voltage input from an external power source, and a second light emitting portion 600 connected to the controller 500. The first, second, third and fourth power connection terminals 410, 420, 510 and 520 are connected to the external power source.

The controller 500 is to control the voltage applied to the second light emitting portion 600. For example, as shown in FIG. 8, the controller 500 controls the voltage input from the outside in accordance with time and outputs the voltage. Referring to FIG. 8, the controller transmits the voltage input from the external power source for 12 hours. Thereafter, the controller allows no voltage to be applied for next 12 hours. That is, the controller transmits the external voltage to the second light emitting portion 600 for 12 hours a day to drive it, and then, allows the external voltage not to be applied to the second light emitting portion 600 for next 12 hours thus not driving it.

The operation of such a light emitting apparatus will be discussed below. The external power is applied to the first light emitting portion 400 and the controller 500, so that the first light emitting portion 400 emits daylight white light with a color temperature of 5700K or more. The controller 500 also controls the voltage in accordance with time to apply it to the second light emitting portion 600, i.e., as described above, the controller can transmit the voltage applied from the outside to the second light emitting portion 600 for 12 hours a day to drive it and then allow the voltage applied from the outside not to be applied to the second light emitting portion 600 for next 12 hours thus not driving it. That is, warm white light with low color temperature can be implemented for 12 hours a day, e.g., at night, due to the mixture of the white light emitted from the first light emitting portion 400 and the red light emitted from the second light emitting portion 600. Thereafter, the power is applied only to the first light emitting portion 400 for next 12 hours, e.g., in the daytime, so that daylight white light with a color temperature of 5700K or more can be implemented.

Although on/off control of the power applied to the second light emitting portion 600 has been described as an example in the foregoing, the present invention is not limited thereto but a variety of controls may be applied. For example, the light emitting intensity of the second light emitting portion 600 can be increased or decreased by increasing or decreasing the voltage in accordance with time. Accordingly, the light emitting apparatus may be formed such that the color temperature of the white light emitted from the light emitting apparatus gradually rises or lowers.

Since such a light emitting apparatus can control the operation of the second light emitting portion through the controller, the operation of the first and second light emitting portions can be variously applied as desired. That is, it is possible to manufacture a light emitting apparatus, in which color temperature is automatically adjusted in accordance with time without an additional input. For example, a light emitting apparatus can be formed to implement daylight white light in the daytime and warm white light at night as described above.

Although the controller for controlling a voltage in accordance with time has been described in the aforementioned example, the present invention is not limited thereto, but the controller may further comprise an additional input unit in order for color temperature to be adjusted as a user desires. Further, although the example, in which an external voltage is simultaneously applied to the first light emitting portion and the controller, has been described, the present invention is not limited thereto. That is, it will be apparent that the first light emitting apparatus and the controller may be respectively connected to external power sources to be independently driven.

Further, in the present invention, a controller may be formed in each of the first and second light emitting portions. This will be described below in the following third embodiment. The detailed descriptions overlapping with those of the first and second embodiments will be omitted.

Figure 9:
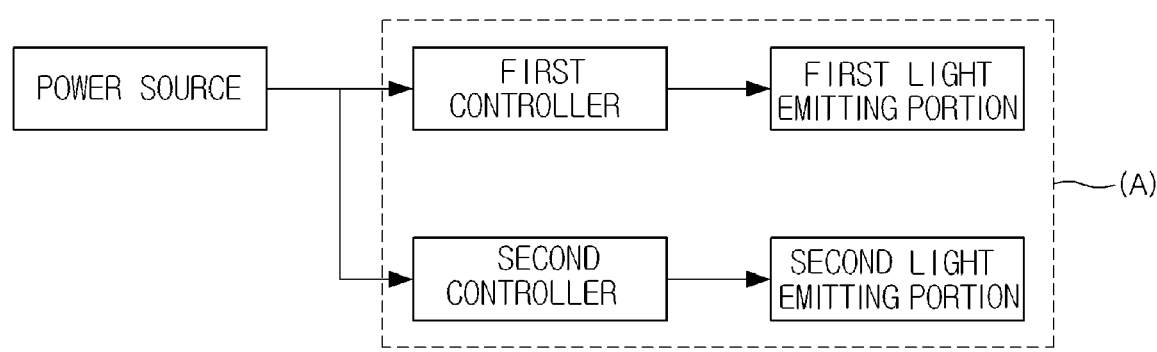
FIG. 9 is a block diagram conceptually illustrating a third embodiment according to the present invention.

FIG. 9 is a block diagram conceptually illustrating the third embodiment according to the present invention.

Referring to FIG. 9, a light emitting apparatus comprises a first light emitting portion emitting white light with a color temperature of 5700K or more, a second light emitting portion emitting red-based light, a first controller connected to the first light emitting portion, and a second controller connected to the second light emitting portion.

The first controller can control the voltage applied to the first light emitting portion, and the second controller can control the voltage applied to the second light emitting portion. Accordingly, the light emitting intensity of the first light emitting portion can be adjusted, and simultaneously, the light emitting intensity of the second light emitting portion can also be adjusted. Thus, a light emitting apparatus implementing white light with various light emitting intensities and color temperatures can be manufactured.

The first or second controller comprises a timer and a voltage controller circuit, so that the voltage can be controlled in accordance with time. Further, there is provided an additional input unit, so that the light emitting intensity and color temperature can be adjusted as a user desires. Although the example, in which the external power is simultaneously applied to the first and second controllers, has been described, the present invention is not limited thereto. It will be apparent that the first and second controllers may be respectively connected to external power sources to be independently driven. Further, the light emitting apparatus may comprise only one controller capable of simultaneously controlling the first and second light emitting portions.

Thus, according as the light emitting apparatus implementing white light with various color temperatures is manufactured, it can be variously applied in various ways and a multifunctional light emitting apparatus in a package is possible. Further, there is an advantage in that a light emitting apparatus, which included additional packages in a prior art, is formed in the single package, thereby reducing the cumbersomeness in a process, enhancing the space efficiency, and reducing the costs.

Although the present invention has been described in connection with the preferred embodiments, it will be understood by those skilled in the art that various modifications and changes can be made thereto without departing from the spirit and scope of the invention defined by the appended claims.

According as the light emitting apparatus implementing white light with various color temperatures is manufactured, it can be variously applied in various ways and a multifunctional light emitting apparatus in a package is possible. Further, there is an advantage in that a light emitting apparatus, which included additional packages in a prior art, is formed in the single package, thereby reducing the cumbersomeness in a process, enhancing the space efficiency, and reducing the costs.

The invention claimed is:

1. A light emitting apparatus, comprising:
   a first light emitting portion to emit white light with a color temperature of 5700K or more;
   a second light emitting portion to change the color temperature of the white light emitted from the first light emitting portion; and
   a molding member encapsulating the first light emitting portion and the second light emitting portion such that the first light emitting portion and the second light emitting portion are encapsulated together by the same molding member,
   wherein the first light emitting portion and the second light emitting portion are independently driven by a voltage output by a first power source and a voltage output by a second power source, respectively.

2. The light emitting apparatus as claimed in claim 1, wherein the first light emitting portion and the second light emitting portion are simultaneously driven to have a color temperature in the range of 2800 to 3700K.

3. The light emitting apparatus as claimed in claim 1, wherein the first light emitting portion comprises an ultraviolet light emitting diode chip and red, green, and blue light emitting phosphors.

4. The light emitting apparatus as claimed in claim 1, wherein the first light emitting portion comprises a light emitting diode chip to emit blue light, and a phosphor to emit yellow light.

5. The light emitting apparatus as claimed in claim 1, wherein the second light emitting portion comprises at least one light emitting diode chip emitting light with a wavelength of 510 to 760 nm.

6. The light emitting apparatus as claimed in claim 5, wherein the second light emitting portion comprises a plurality of light emitting diode chips emitting light with different wavelengths, and the plurality of light emitting diode chips can be selectively driven.

7. The light emitting apparatus as claimed in claim 1, wherein the molding member has a hemispherical surface to emit light generated by the first and second light emitting portions.

8. The light emitting apparatus as claimed in claim 7, wherein the first light emitting portion is disposed at the center of the hemispherical surface.

9. The light emitting apparatus as claimed in claim 1, further comprising a controller to control at least one of the first power source and the second power source.

10. The light emitting apparatus as claimed in claim 9, wherein the controller controls the voltage output by the first power source and/or the second power source, in accordance with time.

11. The light emitting apparatus as claimed in claim 10, wherein the controller controls only the second voltage source.

12. The light emitting apparatus as claimed in claim 1, further comprising a reflector surrounding the first and second light emitting portions.

13. The light emitting apparatus as claimed in claim 12, wherein the reflector is disposed at an outer circumference of the molding member.

14. The light emitting apparatus as claimed in claim 13, wherein the molding member has a flat surface to emit light generated by the first and second light emitting portions.

15. The light emitting apparatus as claimed in claim 14, wherein the reflector has an upper surface which is substantially at the same level as the flat surface of the molding member.

16. A light emitting apparatus, comprising:
a power source to output a voltage;
a first light emitting portion to emit white light with a color temperature of 5700K or more, the first light emitting portion is driven by the voltage;
a second light emitting portion to change the color temperature of the white light emitted from the first light emitting portion;
a molding member encapsulating the first light emitting portion and the second light emitting portion such that the first light emitting portion and the second light emitting portion are encapsulated together by the same molding member; and
a controller to control the second light emitting portion, the controller is connected between the power source and the second light emitting portion.

17. The light emitting apparatus as claimed in claim 16, wherein the controller controls the voltage applied to the second light emitting portion according to time.

18. The light emitting apparatus as claimed in claim 16, wherein the second light emitting portion comprises at least one of an amber, orange, yellow and red emitting diode chip.

* * * * *

UNITED STATES PATENT AND TRADEMARK OFFICE
CERTIFICATE OF CORRECTION

PATENT NO. : 8,282,238 B2  
APPLICATION NO. : 12/159677  
DATED : October 9, 2012  
INVENTOR(S) : Jae Jo Kim Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 580 days.

Signed and Sealed this  
Tenth Day of June, 2014

Michelle K. Lee  
*Deputy Director of the United States Patent and Trademark Office*